United States Patent
Clark et al.

(10) Patent No.: US 6,804,120 B2
(45) Date of Patent: Oct. 12, 2004

(54) METHOD AND APPARATUS FOR CONNECTING CIRCUIT BOARDS FOR A SENSOR ASSEMBLY

(75) Inventors: Jeffrey A. Clark, Sterling Heights, MI (US); Brian M. Curtis, Waukesha, WI (US)

(73) Assignee: Siemens VDO Automotive Corporation, Auburn Hills, MI (US)

( * ) Notice: Subject to any disclaimer, the term of this patent is extended or adjusted under 35 U.S.C. 154(b) by 3 days.

(21) Appl. No.: 10/306,396

(22) Filed: Nov. 27, 2002

(65) Prior Publication Data

US 2003/0112607 A1 Jun. 19, 2003

Related U.S. Application Data

(60) Provisional application No. 60/341,489, filed on Dec. 18, 2001.

(51) Int. Cl.[7] .................................................. H05K 1/14
(52) U.S. Cl. .................. 361/736; 361/785; 361/789; 361/803; 439/65; 439/862
(58) Field of Search .................. 361/736, 785, 361/789, 788, 803, 787, 774, 740, 790, 735, 728; 439/65, 862

(56) References Cited

U.S. PATENT DOCUMENTS

| | | | |
|---|---|---|---|
| 4,250,536 A | * | 2/1981 | Barringer et al. ............ 361/787 |
| 4,689,719 A | * | 8/1987 | Prussas et al. ............... 361/715 |
| 4,978,307 A | | 12/1990 | Billman et al. |
| 5,104,324 A | * | 4/1992 | Grabbe et al. ................. 439/62 |
| 5,151,046 A | * | 9/1992 | Korsunky et al. ........... 439/326 |
| 5,458,497 A | | 10/1995 | Yasumura et al. |
| 5,536,179 A | * | 7/1996 | Olsson et al. ................ 439/108 |
| 5,695,353 A | * | 12/1997 | Sakata et al. ................ 439/326 |
| 5,908,333 A | * | 6/1999 | Perino et al. ................ 439/631 |
| 6,151,220 A | * | 11/2000 | Sakamoto et al. ........... 361/773 |
| 6,304,082 B1 | * | 10/2001 | Gualtieri et al. ............. 324/252 |

FOREIGN PATENT DOCUMENTS

| DE | 24 41 209 | 3/1976 |
|---|---|---|
| EP | 0 851 539 | 7/1998 |

* cited by examiner

*Primary Examiner*—David A. Zarneke
*Assistant Examiner*—Thanh Y. Tran

(57) ABSTRACT

A method and apparatus for connecting circuit boards together in a sensor assembly includes a connector that allows the circuit boards to be positioned generally perpendicular to each other. The connector includes a first end that is received within an opening formed at one edge of a main circuit board. A second end of the connector includes a resilient hook or clip that grippingly engages opposing sides of an auxiliary circuit board. The connector comprises an electrical contact between the main and auxiliary circuit boards. The perpendicular orientation of the auxiliary circuit board to the main circuit board allows for more compact packaging.

11 Claims, 1 Drawing Sheet

METHOD AND APPARATUS FOR CONNECTING CIRCUIT BOARDS FOR A SENSOR ASSEMBLY

CROSS-REFERENCE TO RELATED APPLICATIONS

The application claims priority to U.S. Provisional Application No. 60/341,489, which was filed on Dec. 18, 2001.

BACKGROUND OF THE INVENTION

In general, this invention relates to a method and apparatus for interconnecting circuit boards to provide a more compact sensor assembly. Specifically, a connector member is used to orientate an auxiliary circuit board perpendicular to a main circuit board as well as to provide an electrical contact between the auxiliary and main circuit boards.

Circuit boards are used to provide the electronics for sensor assemblies used in various vehicle applications. In some configurations, each sensor assembly includes a main circuit board assembly with at least one auxiliary circuit board positioned adjacent to the main circuit board to provide additional electronics for the sensor assembly. The auxiliary and main circuit boards are usually either spaced apart from one another in a common plane and attached by edge connections or stacked on top of each other in a parallel formation and interconnected by pins.

Due to more restrictive packaging constraints in recent vehicle configurations, the sensor assemblies are required to be more compact than traditional sensor sizes. One disadvantage with the current attachment method and apparatus for circuit boards is that a significant amount of the available packaging space is taken up by the parallel and/or adjacent orientation of the boards relative to each other.

Thus, it is desirable to provide a method and apparatus for interconnecting circuit boards that results in a more compact assembly while still providing electrical contact between the boards as well as overcoming the other above mentioned deficiencies with the prior art.

SUMMARY OF THE INVENTION

A circuit board assembly for a sensor includes a pair of circuit boards electrically connected to each other with a connector. A first board includes a first mounting portion, a second board includes a second mounting portion, and at least one connector cooperates with the first and second mounting portions to position the boards generally perpendicular to each other.

Preferably, the circuit board assembly includes a main circuit board and an auxiliary circuit board that is positioned at approximately ninety degrees relative to the main circuit board. The connector includes a first end that is received within an opening in the main circuit board and a second end that includes a clip for gripping opposing sides of the auxiliary circuit board.

In one disclosed embodiment, the main circuit board includes an opening positioned at one edge and defined by a first cross-sectional shape. The first end of the connector is defined by a second cross-sectional shape that is different than the first cross-sectional shape. In one embodiment, the first cross-sectional shape is curvilinear and the second cross-sectional shape is polygonal.

In one disclosed embodiment, the clip comprises a U-shaped member having a first leg portion for resiliently engaging one side of the auxiliary circuit board and second leg portion for resiliently engaging an opposite side of the auxiliary circuit board. The first and second leg portions are interconnected by a curved base portion.

The method for attaching a main circuit board to an auxiliary circuit board includes the following steps. A first end of the connector is attached to the main circuit board. The auxiliary circuit board is positioned generally ninety degrees relative to the main circuit board, and one edge of the auxiliary circuit board is gripped by the second end of the connector to electrically connect the main circuit board to the auxiliary circuit board.

The subject system and method provides a more compact sensor assembly by orientating circuit board generally perpendicularly to each other while still providing electrical contact between the boards. These and other features of the present invention can be best understood from the following specifications and drawings, the following of which is a brief description.

DETAILED DESCRIPTION OF A PREFERRED EMBODIMENT

Figure 1:
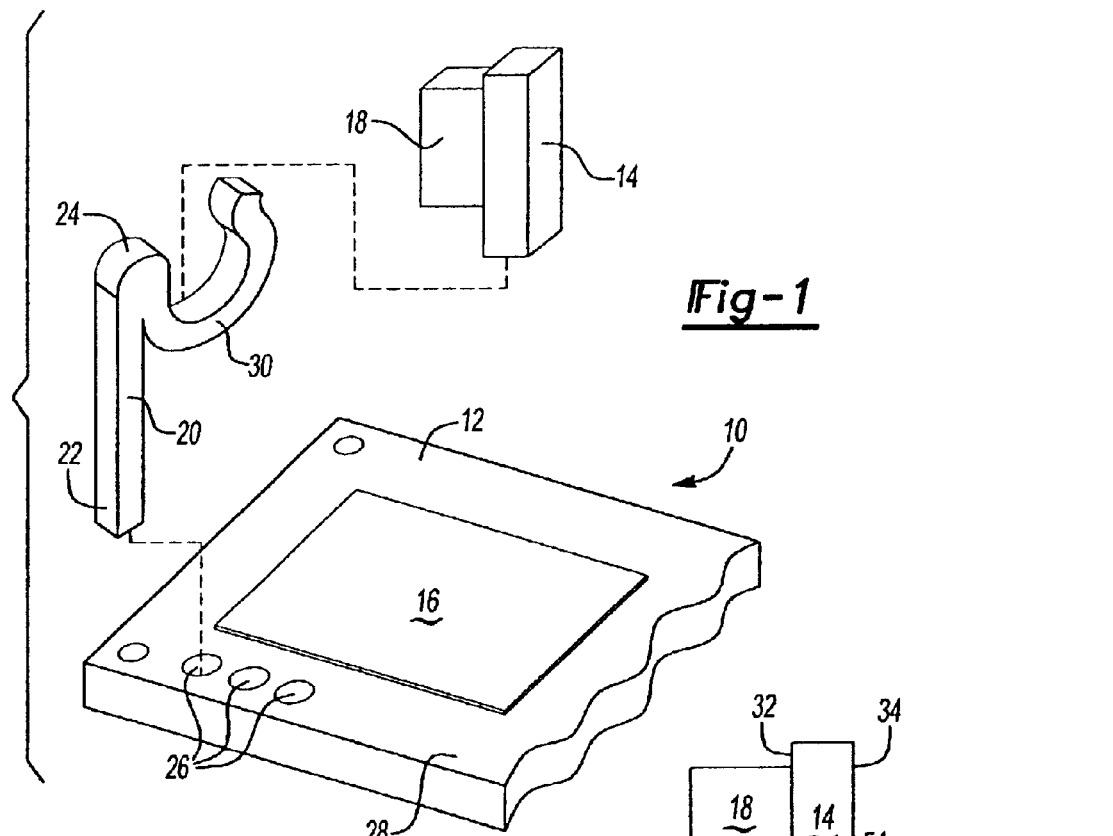
FIG. 1 is an exploded view of a circuit board assembly incorporating the subject invention.

A sensor assembly is shown generally at 10 in FIG. 1. The sensor assembly 10 includes a first or main printed circuit board 12 and at least one second or auxiliary printed circuit board 14. The main printed circuit board 12 includes a first set of electronics 16 and the auxiliary printed circuit board 14 includes a second set of electronics 18 that provide additional features for the sensor assembly 10.

A connector 20 is used to provide an electrical contact between the main 12 and auxiliary 14 printed circuit boards. Preferably, the connector 20 includes a first end 22 that cooperates with the main printed circuit board 12 and a second end 24 that cooperates with the auxiliary circuit board 14 to attach the boards 12, 14 to each other in a generally perpendicular or ninety degree relationship. The first end 22 is preferably received within an aperture 26 formed at one edge 28 of the main printed circuit board 12 and soldered into place; however, other attachment methods could also be used. The second end 24 of the connector 20 preferably includes a resilient hook or clip portion 30 that is used to snap on to or to grip the auxiliary printed circuit board 14. Any type of clip known in the art, having any type of shape, could be used for this application.

Figure 2:
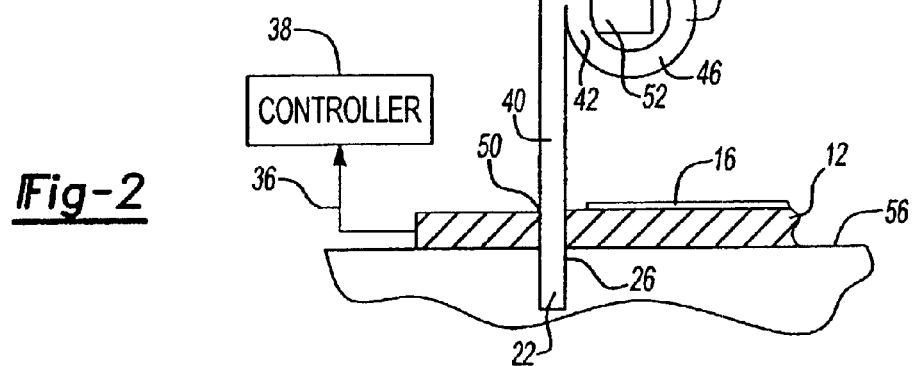
FIG. 2 is a side view of the assembly of FIG. 1.

As shown in FIG. 2, the auxiliary printed circuit board 14 includes a generally planar first surface 32 and an opposing generally planar second surface 34. The clip portion 30 engages both the first 32 and second 34 surfaces. The clip portion 30 and connector 20 provide an electrical contact path between the electronics 18 on the auxiliary printed circuit board 14 and the electronics 16 on the main printed circuit board 12. The electronics 16, 18 generate a sensor signal 36 that is transferred to a controller 38 that uses the sensor data to make decisions under crash or high impact force conditions.

The connector 20 preferably comprises a generally linear body member 40 that extends from the first end 22 to the second end 24. The clip portion 30 includes a first leg portion 42 that extends downwardly from the second end 24 toward the first end 22 and a second leg portion 44 that extends upwardly away from the first end 22. A curved base portion 46 integrally connects the first 42 and second 44 leg portions to form a U-shape. The second leg portion 44 includes a transverse distal tip portion 48 that extends outwardly in a direction away from the auxiliary printed circuit board 14.

As described above, the first end 22 of the connector 20 is received within an aperture 26 formed within the main printed circuit board 12 and is soldered at 50 to attach the connector 20 to the main printed circuit board 12. In one disclosed embodiment, the opening 26 in the main printed circuit board 12 is defined by a first cross-sectional shape and the first end 22 of the connector 20 is defined by a second cross-sectional shape. While the first and second cross-sectional shapes could be identical, in the preferred embodiment the first and second cross-sectional shapes are different from each other. For example, as shown in FIG. 1, the aperture 26 is defined by a curvilinear surface and the first end 22 of the connector 20 is defined by a polygonal shape. It should be understood that any cross-sectional shape or combination of cross-sectional shapes for the aperture 26 and first end 22 could be used.

Figure 3:
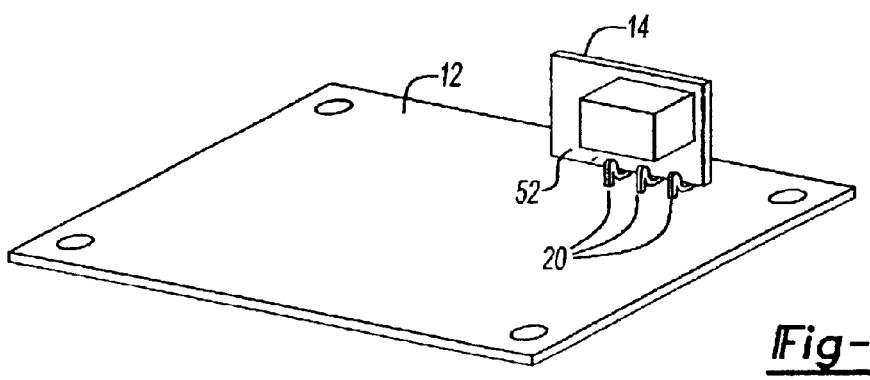
FIG. 3 is a perspective view of an alternate embodiment of a circuit board assembly incorporating the subject invention.

One edge 52 of the auxiliary printed circuit board 14 is slid or snapped into place between the first 42 and second 44 leg portions and soldered at 54 to attach the connector 20 to the auxiliary printed circuit board 14. The main printed circuit board 12 is then preferably mounted to an enclosure or housing component or other vehicle structure component 56. At least one connector 20 is used to orientate the auxiliary printed circuit board 14 perpendicular to the main printed circuit board 12. Depending upon the size of the auxiliary printed circuit board 12, additional connectors 20 may be required. As shown in FIG. 3, a plurality of connectors 20 are used to attach the auxiliary printed circuit board 14 to the main printed circuit board 12. The connectors 20 are spaced apart from one another along the edge 52 of the auxiliary printed circuit board 14.

It should be understood that this configuration is useful for any sensor application known in the art, however, the configuration is especially useful in crash sensor configurations. The perpendicular orientation of the boards 12, 14 to each other results in a more compact sensor assembly 10.

Although a preferred embodiment of this invention has been disclosed, a worker of ordinary skill in this art would recognize that certain modifications would come within the scope of this invention. For that reason, the following claims should be studied to determine the true scope and content of this invention.

What is claimed:

1. A sensor assembly comprising:
   a main circuit board supported by a vehicle structure and having a first set of sensor electronics positioned centrally on said main circuit board and a first mounting portion formed along one edge of said main circuit board;
   an auxiliary circuit board having a second set of sensor electronics and a second mounting portion formed along a lower edge of said auxiliary circuit board; and
   at least one connector having a first end for attachment to said first mounting portion and a second end for resiliently engaging said second mounting portion to attach said auxiliary circuit board to said main circuit board wherein said connector provides an electrical contact between said main and auxiliary circuit boards.

2. An assembly as set forth in claim 1 wherein said at least one connector comprises a plurality of discrete connectors spaced apart and separated from each other along said lower edge of said auxiliary circuit board.

3. An assembly as set forth in claim 1 wherein said auxiliary circuit board is mounted approximately ninety degrees relative to said main circuit board.

4. An assembly as set forth in claim 3 wherein said first end is defined by a non-circular cross-section and is received within an aperture defined by a curvilinear surface in said main circuit board.

5. An assembly as set forth in claim 3 wherein said first and second sets of sensor electronics generate a sensor signal, said sensor signal being communicated to a controller for making vehicle control decisions under high impact force conditions.

6. An assembly as set forth in claim 5 wherein said main circuit board is mounted to a sensor housing supported by said vehicle structure.

7. An assembly as set forth in claim 6 wherein said lower edge of said auxiliary circuit board extends parallel to said one edge of said main circuit board such that said auxiliary and main circuit boards form an L-shaped sensor assembly with said sensor housing.

8. An assembly as set forth in claim 7 wherein said wherein said auxiliary circuit comprises a sole auxiliary circuit board said at least one connector comprises a plurality of discrete connectors spaced apart and separated from each other along said one edge of said main circuit board, said connectors cooperating to mount said sole auxiliary circuit board to said main circuit board.

9. An assembly as set forth in claim 1 wherein said second end comprises a hook portion with a pair of resiliently biased legs wherein said legs move outwardly away from one another in response to an insertion force exerted by said auxiliary circuit board against said legs to establish resilient engagement between said auxiliary circuit board and said connector.

10. An assembly as set forth in claim 1 wherein said opposing sides of said auxiliary circuit board comprise a first planar surface and an opposing second planar surface and wherein said second mounting portion comprises a portion of said first and second planar surfaces positioned along said lower edge of said auxiliary circuit board.

11. An assembly as set forth in claim 1 wherein said connector comprises a linear body member vertically extending from said first end to said second end with a resilient grip extending laterally outwardly from said second end with said first and second ends being co-linear.

* * * * *